(12) United States Patent
Reznicek et al.

(10) Patent No.: US 11,069,809 B2
(45) Date of Patent: Jul. 20, 2021

(54) SOI FINFET FINS WITH RECESSED FINS AND EPITAXY IN SOURCE DRAIN REGION

(71) Applicant: GLOBALFOUNDRIES U.S. Inc., Santa Clara, CA (US)

(72) Inventors: Alexander Reznicek, Troy, NY (US); Shogo Mochizuki, Clifton Park, NY (US); Veeraraghavan S. Basker, Schenectady, NY (US); Nicolas L. Breil, Beacon, NY (US); Oleg Gluschenkov, Tannersville, NY (US)

(73) Assignee: GLOBALFOUNDRIES U.S. INC., Santa Clara, CA (US)

( * ) Notice: Subject to any disclaimer, the term of this patent is extended or adjusted under 35 U.S.C. 154(b) by 135 days.

(21) Appl. No.: 15/884,045

(22) Filed: Jan. 30, 2018

(65) Prior Publication Data

US 2018/0175197 A1    Jun. 21, 2018

Related U.S. Application Data

(62) Division of application No. 15/160,099, filed on May 20, 2016, now Pat. No. 9,905,692.

(51) Int. Cl.
*H01L 29/78* (2006.01)
*H01L 29/165* (2006.01)
*H01L 29/66* (2006.01)

(52) U.S. Cl.
CPC ........ *H01L 29/7848* (2013.01); *H01L 29/165* (2013.01); *H01L 29/66795* (2013.01); *H01L 29/785* (2013.01)

(58) Field of Classification Search
CPC ......... H01L 21/823431; H01L 29/7848; H01L 29/165; H01L 29/66795; H01L 29/785
See application file for complete search history.

(56) References Cited

U.S. PATENT DOCUMENTS

| | | | |
|---|---|---|---|
| 7,006,786 B2 | 2/2006 | Marcus et al. | |
| 7,566,605 B2 | 7/2009 | Shifren et al. | |
| 8,847,281 B2 | 9/2014 | Cea et al. | |
| 8,957,477 B2 | 2/2015 | Chang et al. | |
| 9,000,498 B2 | 4/2015 | Morin | |
| 9,006,842 B2 | 4/2015 | Colinge et al. | |
| 9,054,189 B1 * | 6/2015 | Kim | H01L 29/785 |
| 9,431,399 B1 * | 8/2016 | Alptekin | H01L 29/41791 |
| 2007/0221956 A1 | 9/2007 | Inaba | |
| 2008/0237655 A1 | 10/2008 | Nakabayashi et al. | |

(Continued)

FOREIGN PATENT DOCUMENTS

CN    104347716 A    7/2014

*Primary Examiner* — Vongsavanh Sengdara
(74) *Attorney, Agent, or Firm* — Hoffman Warnick LLC (57) ABSTRACT

Fabrication method for a semiconductor device and structure are provided, which includes: providing an isolation layer at least partially disposed adjacent to at least one sidewall of a fin structure extended above a substrate structure, the fin structure including a channel region; recessing an exposed portion of the fin structure to define a residual stress to be induced into the channel region of the fin structure, wherein upper surfaces of a recessed fin portion and the isolation layer are coplanar with each other; and epitaxially growing a semiconductor material from the recessed exposed portion of the fin structure to form at least one of a source region and a drain region of the semiconductor device.

20 Claims, 5 Drawing Sheets

(56) References Cited

U.S. PATENT DOCUMENTS

| | | |
|---|---|---|
| 2012/0025313 A1 | 2/2012 | Chang et al. |
| 2012/0091538 A1* | 4/2012 | Lin .................. H01L 29/66636 |
| | | 257/401 |
| 2013/0230958 A1* | 9/2013 | Lee ................ H01L 21/823431 |
| | | 438/283 |
| 2014/0361338 A1 | 12/2014 | Kerber et al. |
| 2015/0008484 A1 | 1/2015 | Cea et al. |
| 2015/0035008 A1 | 2/2015 | Kittl et al. |
| 2015/0076514 A1 | 3/2015 | Morin et al. |
| 2015/0333061 A1* | 11/2015 | Kim .................. H01L 29/7849 |
| | | 257/401 |
| 2017/0062601 A1* | 3/2017 | Basker ................ H01L 21/268 |

* cited by examiner

SOI FINFET FINS WITH RECESSED FINS AND EPITAXY IN SOURCE DRAIN REGION

CROSS REFERENCE TO RELATED APPLICATION

This application is a divisional of U.S. patent application Ser. No. 15/160,099, filed May 20, 2016 the entire content and disclosure of which is incorporated herein by reference.

FIELD OF THE INVENTION

The present invention relates to semiconductor devices and to methods for forming semiconductor devices, and more particularly, to a fin-type field-effect transistor with recessed fin structure(s).

BACKGROUND

Fin-type field-effect transistor (FinFET) devices continue to be developed to replace traditional planar metal-oxide-semiconductor field-effect transistors (MOSFETs) in advanced complementary metal oxide semiconductor (CMOS) technology, due to their improved short-channel effect immunity and higher on-current to off-current ratio ($I_{on}/I_{off}$). As is known, the term "fin" refers to a vertical structure within or upon which are formed, for example, one or more FinFETs or other fin devices, including capacitors, diodes, etc.

Enhancements in fin device structures and fabrication methods continue to be desired for enhanced performance and commercial advantage.

BRIEF SUMMARY

Certain shortcomings of the prior art are overcome and additional advantages are provided through the provision, in one aspect, of a method for fabricating a semiconductor device which includes, for instance, providing an isolation layer at least partially disposed adjacent to at least one sidewall of a fin structure extended above a substrate structure, the fin structure including a channel region; recessing an exposed portion of the fin structure to define a residual stress to be induced into the channel region of the fin structure, wherein upper surfaces of a recessed fin portion and the isolation layer are coplanar with each other; and epitaxially growing a semiconductor material from the recessed exposed portion of the fin structure to form at least one of a source region and a drain region of the semiconductor device.

In a further aspect, a semiconductor device which includes, for instance, a fin structure extended above a substrate structure, the fin structure comprising a channel region of a first height, and a recessed fin portion of a second height that is less than the first height; and an epitaxially-grown semiconductor material extending laterally out from each recessed fin portion to form at least one of a source region and a drain region of the semiconductor device, wherein a lower surface of the epitaxially-grown semiconductor material extends, at least in part, in a spaced opposing relation to at least one sidewall of each recessed fin portion.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in details. It should be understood, however, that the detailed description and the specific examples, while indicating embodiments of the invention, are given by way of illustration only, and not by way of limitation. Various substitutions, modifications, additions and/or arrangements within the spirit and/or scope of the underlying inventive concepts will be apparent to those skilled in the art from this disclosure.

The present invention provides, in part, a method for forming a semiconductor device, for example, FinFET with recessed fin structures, and a source region and a drain region disposed over the recessed fin structure, which advantageously improve circuit performance by exerting asymmetric stress across, for example, the channel region of a FinFET device. In operation of a FinFET, when an appropriate voltage is applied on a gate structure, charge carriers (for instance, electrons (generated by n-type dopants) or holes (generated by p-type dopants)) flow from a source region to a drain region of the transistor through the channel region. Several issues may arise during FinFET fabrication processing. These issues could negatively impact performance or yield of integrated circuits containing the FinFETs. As one skilled in the art will understand, the conductivity of the channel region is traditionally improved by applying stress to the channel region of the FinFETs. In one example, the compressive stress may be applied to the channel region of a p-type FET (PFET) device and a tensile stress may be applied to the channel region of an n-type FET (NFET) device which, for instance, increases the mobility of holes or electrons, respectively, thereby increasing the speed and performance of the FinFETs. By way of example, the residual stress in the channel region may be improved by stressing the source region and the drain region of the fin structures using, for instance, epitaxially-grown semiconductor material disposed thereover. Disadvantageously, such epitaxial growth process, for instance, results in the semiconductor material being formed on the sidewalls of the fin structures or fins which, for instance, may be ineffective in transferring the stress to the channel regions of the FinFET devices. Alternatively, the fins may be recessed and may be re-grown to facilitate the epitaxial growth of the semiconductor material. In such a case, as one skilled in the art will understand, the residual stress being transferred from the epitaxially-grown semiconductor material may be dependent upon the depth of the recessed fins. Disadvantageously, as the size of the technology nodes continues to decrease, the recessing of the fins may be prone to loading effects resulting, for instance, in lack of planarity or uniformity of the height of the resultant fins, owing to the fin pitch. This, in turn, could cause performance degradation of the resultant devices. Further, conventional fin recessing techniques typically involve prolonged recessing to achieve the planarity of the fins which, for instance, risks a complete removal of the fins; thereby destroying the resultant FinFET device.

In one aspect of the present invention, there is disclosed a method for forming a semiconductor device which includes, for instance, providing an isolation layer at least partially disposed adjacent to at least one sidewall of a fin structure extended above a substrate structure, the fin structure including a channel region; recessing an exposed portion of the fin structure to define a residual stress to be induced into the channel region of the fin structure, wherein upper surfaces of a recessed fin portion and the isolation layer are coplanar with each other; and epitaxially growing a semiconductor material from the recessed fin portion to form at least one of a source region and a drain region of the semiconductor device.

In one embodiment, the epitaxially growing of the semiconductor material may include epitaxially growing the semiconductor material to extend laterally out from the recessed fin portion to define a lower surface of the at least one of the source region and the drain region, with the lower surface extending, at least in part, in a spaced opposing relation to the at least one sidewall of the fin structure. In one implementation, the lower surface of the at least one of the source region and the drain region extends symmetrically laterally out from the recessed fin portion. Further, in another implementation, the semiconductor material may include, or be fabricated of, a stressor material (for example, a silicon germanium material), where the epitaxial growth of the semiconductor material over the recessed fin portion exerts an asymmetric stress across the channel region of the fin structure. For instance, the residual stress to be induced into the channel region of the fin structure may be dependent on the height of the recessed fin portion, with the total height of the recessed fin portion may be within a range from about 2 nm to about 5 nm.

Further, and in another embodiment, the fin structure may include opposite first and second sidewalls, with the isolation layer being disposed adjacent to the first sidewall and the second sidewall on opposite sides of the fin structure. In this example, the recessing of the exposed portion of the fin structure may include mechanically stabilizing the exposed portion of the fin structure with the isolation layer during the recessing thereof. The fabrication method may further include a gate structure extending at least partially over the fin structure and over the isolation layer, where the recessing of the exposed portion of the fin structure may include recessing the exposed portion of the fin structure, along with the isolation layer, with the recessing being terminated, at least in part, at a lower surface of the gate structure. In yet another embodiment, the fabrication method may further include etching the isolation layer, subsequent to the epitaxial growth of the semiconductor material, to undercut the semiconductor material disposed over the recessed fin portion, while leaving, at least in part, the isolation layer disposed below the gate structure.

In another embodiment, the epitaxially growing may further include epitaxially growing an additional semiconductor material over the semiconductor material to increase a width of the at least one of the source region and the drain region. Further, the additional semiconductor material encapsulates the semiconductor material, along with the recessed fin portion, with the additional semiconductor material enhancing an asymmetric stress generated across the channel region of the fin structure. The semiconductor material may include, or be fabricated of, a first silicon germanium material having a first germanium content, and the additional semiconductor material may include, or be fabricated of a second silicon germanium material having a second germanium content, with the first germanium content being different from the second germanium content.

In yet another aspect of the present invention, there is provided a semiconductor device which includes: a fin structure extended above a substrate structure, the fin structure including a channel region of a first height, and a recessed fin portion of a second height that is less than the first height; and an epitaxially-grown semiconductor material extends laterally out from each recessed fin portion to form at least one of a source region and a drain region of the semiconductor device, wherein a lower surface of the epitaxially-grown semiconductor material extends, at least in part, in spaced opposing relation to at least one sidewall of each recessed fin portion.

Reference is made below to the drawings, which are not drawn to scale for ease of understanding, wherein the same reference numbers used throughout different figures designate the same or similar components.

Figure 1A:
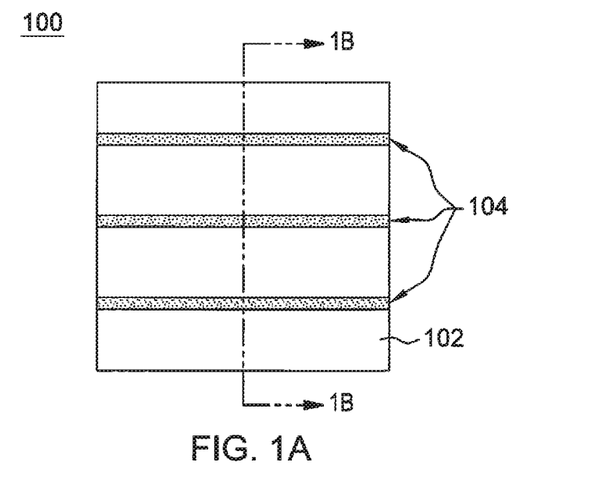
FIG. 1A depicts a plan view of one embodiment of a structure obtained during semiconductor device fabrication, in accordance with one or more aspects of the present invention.
Figure 1B:
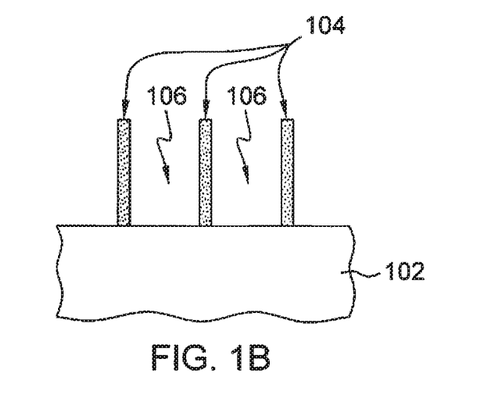
FIG. 1B is a cross-sectional view of the structure of FIG. 1A, taken along line 1B-1B thereof, and illustrating one or more fins extended above a substrate structure, in accordance with one or more aspects of the present invention.
Figure 1C:
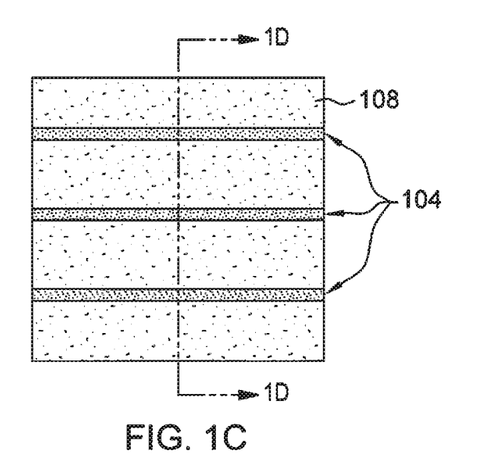
FIG. 1C is a plan view of the structure of FIG. 1A after providing an isolation layer over the substrate structure and between each fin structure, in accordance with one or more aspects of the present invention.
Figure 1D:
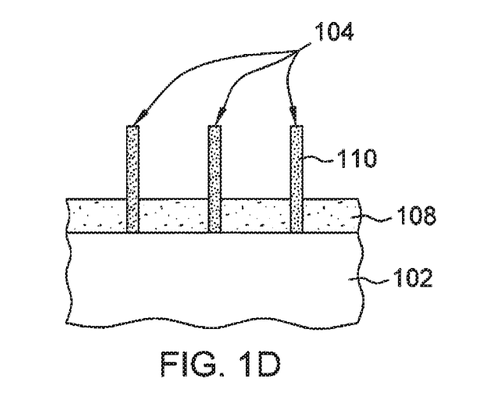
FIG. 1D depicts the structure of FIG. 1C, taken along line 1D-1D thereof, in accordance with one or more aspects of the present invention.
Figure 1E:
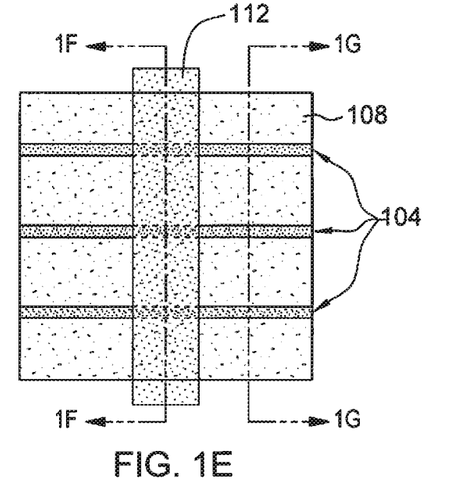
FIG. 1E is a plan view of the structure of FIG. 1C after providing a gate structure extending at least partially over the fin(s) and the isolation layer, in accordance with one or more aspects of the present invention.
Figure 1F:
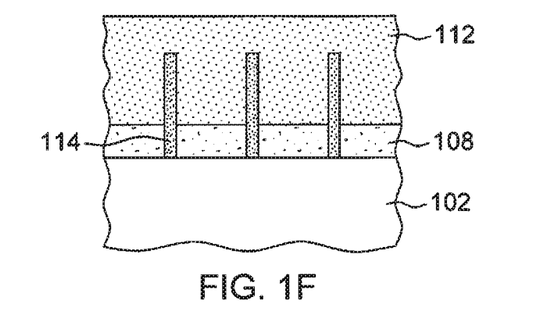
FIG. 1F depicts the structure of FIG. 1E, taken along line 1E-1E thereof, in accordance with one or more aspects of the present invention.
Figure 1G:
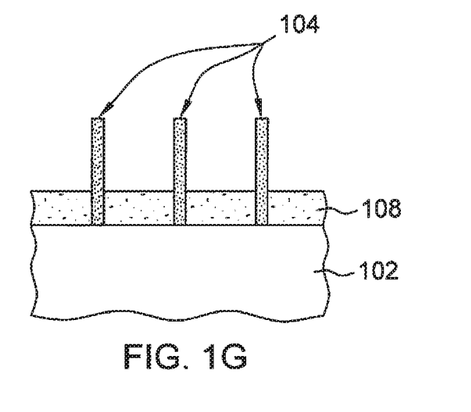
FIG. 1G depicts the structure of FIG. 1E, taken along line 1G-1G thereof, and illustrates one or more exposed portion(s) of the fin(s), in accordance with one or more aspects of the present invention.
Figure 1H:
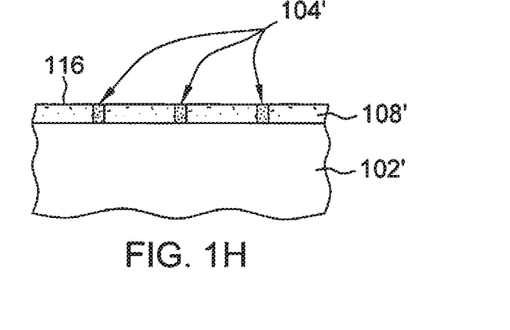
FIG. 1H depicts the structure of FIG. 1G after recessing the exposed portion(s) of the fin(s), in accordance with one or more aspects of the present invention.
Figure 1I:
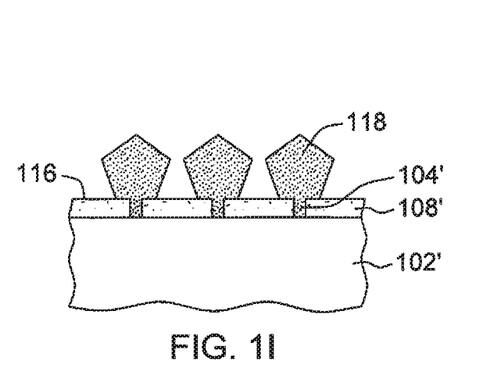
FIG. 1I depicts the structure of FIG. 1H after epitaxial growth of a semiconductor material from the recessed fin portion(s) to form a source region and a drain region, in accordance with one or more aspects of the present invention.
Figure 1J:
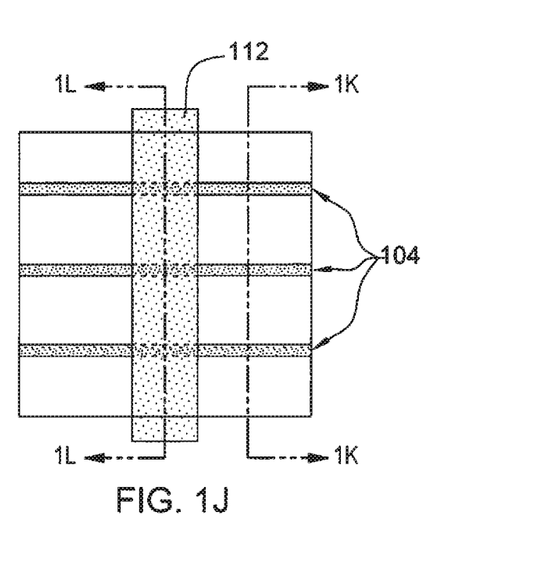
FIG. 1J is a plan view of the structure of FIG. 1I after etching the isolation layer to undercut the semiconductor material disposed over the recessed fin portion(s), in accordance with one or more aspects of the present invention.
Figure 1K:
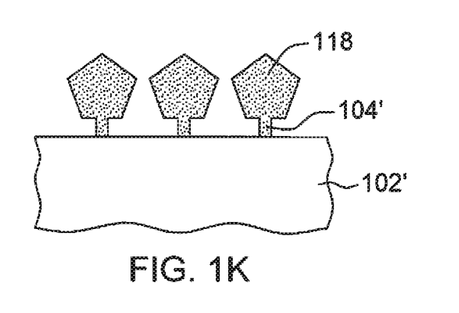
FIG. 1K depicts the structure of FIG. 1J, taken along line 1K-1K thereof, and illustrates the semiconductor material disposed over the recessed fin portion(s), in accordance with one or more aspects of the present invention.
Figure 1L:
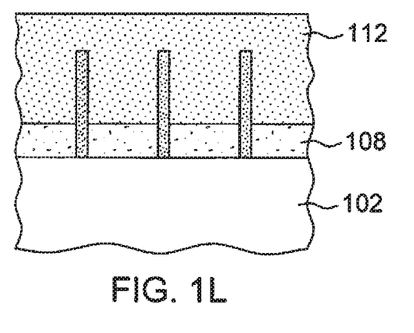
FIG. 1L depicts the structure of FIG. 1J, taken along line 1L-1L thereof, and illustrates the isolation layer disposed below the gate structure, in accordance with one or more aspects of the present invention.
Figure 1M:
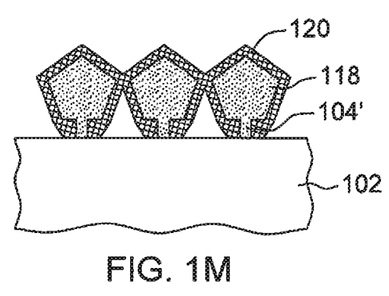
FIG. 1M depicts the structure of FIG. 1K after epitaxially growing an additional semiconductor material over the semiconductor material disposed over the recessed fins, in accordance with one or more aspects of the present invention.
Figure 1N:
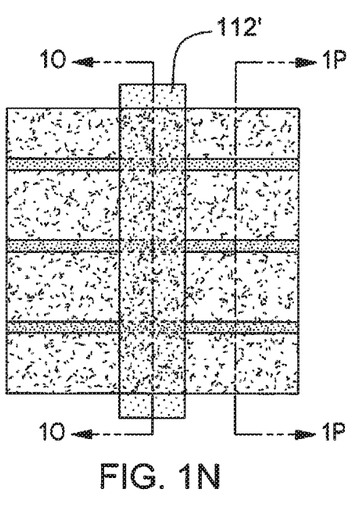
FIG. 1N is a plan view of a resultant structure of FIG. 1M, after subsequent fabrication processing which includes, for instance, gate replacement fabrication process and contact formation over the source and drain region, in accordance with one or more aspects of the present invention.
Figure 1O:
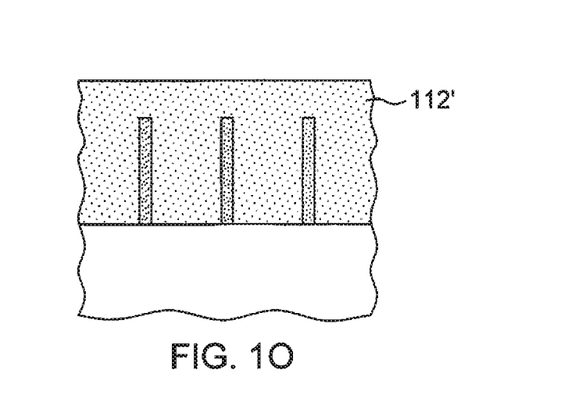
FIG. 1O depicts the structure of FIG. 1N, taken along line 1O-1O thereof, and illustrates the replacement gate structure, in accordance with one or more aspects of the present invention.
Figure 1P:
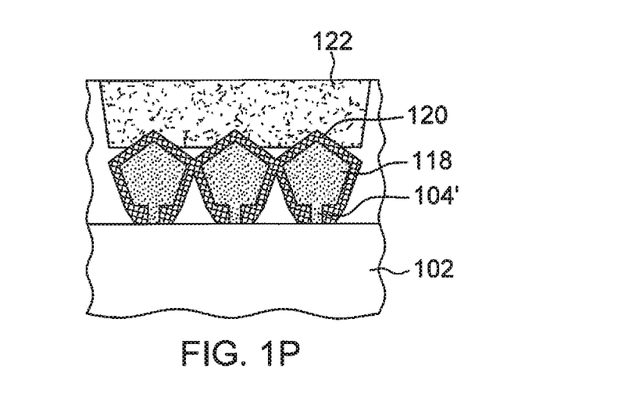
FIG. 1P depicts the structure of FIG. 1N, taken along line 1P-1P thereof, and illustrates the formation of the contacts over the source and drain regions, in accordance with one or more aspects of the present invention.

By way of example, FIGS. 1A-1P depict one embodiment of a method for forming a semiconductor device, for example, a FinFET with recessed fin structures, and a source region and a drain region disposed over the recessed fin structure, in accordance with one or more aspects of the present invention. Advantageously, as described below, the height of recessed fins define the residual stress being induced into the channel region of the FinFET device and the source region and drain region extends laterally out from the recessed fins.

FIGS. 1A and 1B are various views of one embodiment of a structure 100 obtained during a semiconductor device fabrication, in accordance with one or more aspects of the present invention. In the example shown, structure 100 includes a substrate structure 102, which may be (in one example) a bulk semiconductor material such as, for example, a bulk silicon wafer. As another example, substrate structure 102 may be any silicon-containing substrate including, but not limited to, silicon (Si), single crystal silicon (Si), polycrystalline Si, amorphous Si or the like. Substrate structure 102 may in addition, or instead, include various isolations, dopings and/or device features. Optionally, although not depicted in figures, substrate structure 102 may include insulating substrate layer which, for instance, may be, or include, a buried dielectric layer such as, for example, a buried oxide (BOX) layer, silicon-on-nothing (SON), silicon-on-insulator or the like. As one skilled in the art will understand, a buried oxide layer may be fabricated by employing SIMOX (Separation by Implanted Oxygen) technique which, for instance, may include implanting high doses of oxygen ($O^+$) ions into the silicon substrate, and annealing at a high temperature to form a layer of buried oxide over the silicon substrate. In such an example, the fabrication of the buried oxide layer may result in a residual layer of semiconductor material (not shown) which, for instance, may include a silicon material, being disposed over the insulating substrate layer (not shown).

Continuing with FIGS. 1A and 1B, one or more fin structures or fins 104 may be formed extending from substrate structure 102. By way of an example, fins 104 may be formed by patterning one or more portions of substrate structure 102, thereby creating one or more fins 104 of the same material as the substrate structure 102, for example, silicon material. In one example, formation of fins 104 may be achieved by patterning the substrate structure 102 using any of various approaches including: direct lithography; sidewall image transfer technique; extreme ultraviolet technique (EUV); e-beam technique; litho-etch litho-etch or litho-etch litho-freeze. Following patterning, the removal may be performed, for example, by any suitable etching process, such as, anisotropic dry etching processes, for instance, reactive-ion-etching (RIE) process. Although the following numbers are relative and the heights may vary, as one example, fins 104 may have a height of about 20 nm to about 100 nm, and a fin pitch of about 30 nm to about 80 nm. As used herein, "fin pitch" refers to the distance between adjacent fins measured from, for example, a middle point of one fin to a middle point of the adjacent fin. In one example, adjacent fins 104 are separated by a respective opening 106.

FIGS. 1C and 1D are various views of the structure of FIGS. 1A-1B after forming an isolation layer 108 between each fin 104 and each opening 106. By way of an example, the isolation layer 108 may be, or include, an oxide material, such as, silicon oxide, or a flowable oxide material, and may be deposited using a variety of techniques such as, for example, chemical vapor deposition (CVD), plasma-enhanced CVD, sub-atmospheric pressure thermal CVD (SACVD) processes, spin-on coating and the like. An etch-back process may be employed subsequent to the deposition of the material that provides the isolation layer 108. The isolation layer 108, depending on the desired circuit design, may have a thickness from about 50 nm to about 200 nm. The isolation layer 108 may, additionally, serve to electrically isolate the resultant FinFET devices. As depicted in FIG. 1D, and in one example, isolation layer 108 has been provided at least partially within the openings 106 (see FIG. 1B) separating the fins 104, thereby exposing one or more sidewalls 110 of fins 104.

FIGS. 1E-1G are various views of the structure of FIGS. 1C-1D after providing a gate structure 112 extending at least partially over the fin(s) 104 and the isolation layer 108, in accordance with one or more aspects of the present invention. As depicted, the gate structure 112 may extend over fins 104, and may overlap fins 104 in selected areas to operate as, for instance, the gate of a fin-type transistor. As one skilled in the art will understand, a gate material (not shown) may be provided over one or more layers (not shown), such as, for instance, a gate dielectric layer and/or work function layer to form gate structure 112. In one example, the gate material may include, or be fabricated of, a metal, and may be formed as a part of a gate-first fabrication process. In this example, the gate dielectric layer may include, or be fabricated of, a high-k dielectric material with a dielectric constant k greater than the dielectric constant of silicon dioxide (k=3.9 for $SiO_2$), and may be deposited by performing a suitable deposition process, such as atomic layer deposition (ALD), chemical vapor deposition (CVD) or the like. In a particular example, dielectric layer 114 may have a dielectric constant greater than 4.0, and more preferably, greater than 8.0. Examples of high-k dielectric materials which may be used in the dielectric layer include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, and a silicate thereof, and an alloy thereof, where x=0.5 to 3, and y=0 to 2. The gate material (not shown) disposed over the gate dielectric layer may include, or be fabricated of a material such as, for instance, zirconium, tungsten, tantalum, hafnium, titanium, aluminum, or the like.

Alternatively, in another example, the gate material may include, or be fabricated of, a sacrificial gate material, such as an amorphous silicon (a-Si) or polycrystalline silicon (polysilicon), which may subsequently be replaced with a replacement gate material, as part of a gate-last fabrication process. Further, although not depicted in the figures, sidewall spacers which, for instance, may include or be fabricated of, a nitride material (such as, for example, SiN or $Si_3N_4$), may be provided along the sidewalls of the gate structure 112. As understood, these sidewall spacers, for example, having a thickness from about 4 nm to about 12 nm, may be conformally deposited using a variety of techniques, such as, for instance, chemical vapor deposition (CVD) or atomic layer deposition (ALD) processes.

As shown in FIG. 1F, the gate structure 112 wraps up, over and around the fins 104. Further, as depicted, the gate structure 112 also extends, for instance, at least partially over the isolation layer 108 separating the fins 104. In this example, the portion of the fins 104 underlying the gate structure 112 acts as a channel region 114 of the resultant FinFET device.

FIG. 1G illustrates one or more exposed portion(s) of the fin(s), in accordance with one or more aspects of the present invention. As depicted and discussed further below, the source region and the drain region are to be provided over the exposed portion of the fins, not covered by the gate structure 112, during the subsequent fabrication processing.

FIG. 1H illustrates the structure of FIG. 1G after recessing the exposed portion(s) of the fin(s) 104 (see FIG. 1G) to form recessed fins 104', in accordance with one or more aspects of the present invention. In the depicted embodiment, the recessing of the exposed portions of the fins 104 to a desired height, advantageously, facilitates defining a residual stress being induced into the channel region 114 (see FIG. 1F) underlying the gate structure 112 (see FIG. 1F). Although the numbers are relative and the desired height of the recessed fins 104' may vary according to the technology node in which the semiconductor device is being fabricated, in one example, the exposed portions of the fins may be recessed down to a height within a range from about 2 nm to about 5 nm. By way of example, such recessing of the exposed portions of the fins 104 (see FIG. 1G) may be accomplished using one or more isotropic etching processes such as, reactive ion etching (RIE) and the exposed portion of fins 104 (see FIG. 1G) may be etched down to an upper surface of the isolation layer 108 (see FIG. 1G). Note that, the isolation layer 108 separating the fins 104 (see FIG. 1G) facilitates providing structural stability to the fins during the recessing process, thereby mechanically stabilizing the exposed portions of fins. The result is that the upper, exposed surfaces of the recessed fins 104' are substantially coplanar with each other, as well as with an upper surface of the isolation layer 108. Although not depicted in the figures, in one embodiment, the recessing of the exposed portion of the fins proceeds to at least partially recess the isolation layer 108 along with the exposed fin portions, terminating, in this example, at a lower surface of the gate structure 112 (see FIG. 1E), thereby self-limiting the etching distance at the lower surface thereof. This prolonged recessing results in further reducing the fin height; thereby inducing additional stress into the channel region 114 (see FIG. 1F) underlying the gate structure 112. Note that there is no variation in height between the upper surfaces of the recessed fins 104' and recessed isolation layer 108', due to such prolonged recessing, since the previously recessed upper surface of the recessed fins 104' is substantially coplanar with the upper surface of the isolation layer.

FIG. 1I depicts the structure of FIG. 1H after epitaxially growing a semiconductor material from the exposed upper surfaces of the recessed fins 104' to form, for example, a source region and drain region (collectively S/D region 118) of a fin-type transistor, such as, the resultant FinFET device. By way of example, the S/D region 118 may be formed by epitaxially growing the semiconductor material from the exposed upper surface of the recessed fins 104', using selective epitaxial growth processes such as, for example, CVD, low-pressure CVD (LPCVD) or other applicable methods. As used herein, "epitaxially growing/growth" refers to the orderly growth of a semiconductor material over a surface of another semiconductor material, such as, recessed fin 104', where the grown material arranges itself in the same crystal orientation as the underlying material. In one example, the semiconductor material may include, or be fabricated of any conventional doped or undoped semiconductor material such as, silicon, germanium, silicon-germanium alloy, carbon-doped silicon, carbon-doped silicon germanium, and compound (e.g., III-V and II-VI) semiconductor materials or the like.

As depicted, the epitaxially growing of the semiconductor material from the upper surface of the recessed fins 104' proceeds by extending laterally out from the recessed fins 104', with the semiconductor material growing symmetrically and, at least partially, residing over the upper surface 116 of the recessed isolation layer 108'. In the embodiment illustrated, the lower surface of the S/D region 118 is, in part, in spaced opposing relation to the sidewall of recessed fins 104'. Further, as one skilled in the art will understand, owing to difference in growth rates of different crystallographic orientations, the epitaxial growth of the semiconductor material may define the shape of the S/D region 118 resulting, for instance, in shaped-structures such as, diamond shaped structures.

Additionally, the epitaxially grown semiconductor material of the S/D region 118 which, for instance, may include a stressor material, may exert asymmetric stress across the channel region 114 (see FIG. 1F) underlying the gate structure 112 (see FIG. 1F). In one embodiment, the amount of the asymmetric stress exerted across the channel region 114 (see FIG. 1F) by the epitaxially grown semiconductor material is dependent on the height of the recessed fin 104'. For instance, the shorter the height of the recessed fin 104', the more efficient is the transfer of the stress from the epitaxially-grown semiconductor material of the S/D region 118.

Continuing with FIG. 1I, the stress applied by the epitaxially-grown semiconductor material of the S/D region 118 to the channel region 114 (see FIG. 1F) underlying the gate structure (see FIG. 1F) may be tailored to be a compressive stress or a tensile stress, depending upon the type of the transistor being fabricated. For example, transistors such as, PFETs may have holes as majority charge carriers, and compressive stress may increase the mobility of such charge carriers. In such an example, silicon germanium (SiGe), with about 25% to 80% atomic concentration of germanium may be used to achieve the compressive stress. Additionally, the silicon germanium material may be doped with p-type dopants, such as, boron having a dopant concentration of about $2 \times 10^{20}$ atom/$cm^3$ to about $2 \times 10^{21}$ atom/$cm^3$, to enhance the compressive stress within the channel region 114 (see FIG. 1F). In another example, transistors, such as, NFETs may have electrons as charge carriers, and tensile stress may increase the electron mobility. In such an example, carbon-doped silicon material, having about 0.5% to about 2.5% atomic concentration of carbon, may be used to achieve the tensile stress. Additionally, the carbon-doped silicon material may be doped with n-type dopants such as, arsenic having a dopant concentration of about $2 \times 10^{20}$ atom/$cm^3$ to about $2 \times 10^{21}$ atom/$cm^3$ to enhance the tensile stress within the channel region (see FIG. 1F).

FIGS. 1J-1L are various views of the structure of FIG. 1I after etching the recessed isolation layer 108' (see FIG. 1I), in accordance with one or more aspects of the present invention. The recessed isolation layer 108' may be etched using a directional etching process, such as, reactive ion etching (RIE) or plasma etching, to partially undercut the epitaxially-grown semiconductor material 118 disposed over the recessed fins 104', as illustrated in FIG. 1K. Note that, as depicted in FIG. 1L, the presence of the gate structure 108 may serve to limit the anisotropic etching, because, for example, the thickness of the gate structure could laterally limit the etching of the recessed isolation layer 108' below the gate structure 112 by blocking a portion of the anisotropic etching from reaching below the gate structure, independent of the etch time or other process parameters employed. In one example, the recessed isolation layer 108' may be etched via an aqueous hydrofluoric acid (HF) etching process.

FIG. 1M depicts the structure of FIG. 1K after epitaxially growing an additional semiconductor material 120 over the semiconductor material of the S/D region 118, in accordance with one or more aspects of the present invention. As illustrated, the additional semiconductor material 120, in one embodiment, fills the undercut region of the semiconductor material disposed over the recessed fins 104', thereby encapsulating the semiconductor material and the recessed fins 104'. This, for instance, facilitates increasing the width of the S/D region 118, which, in turn, enhances the asymmetric stress exerted across the channel region 114 (see FIG. 1F) underlying the gate structure 112 (see FIG. 1F). By way of an example, the additional semiconductor material may include, or be fabricated of, any conventional doped or undoped semiconductor material similar to the epitaxially grown semiconductor material using any of the methods described above in connection with FIG. 1I. For instance, the additional semiconductor material may be, or include, semiconductor material such as, for example, silicon, germanium, silicon-germanium alloy, carbon-doped silicon, carbon-doped silicon germanium, and compound (e.g., III-V and II-VI) semiconductor materials or the like. Further, in one embodiment, the semiconductor material and the additional semiconductor material may include similar semiconductor material, having varying atomic and/or dopant concentrations. In another example, the semiconductor material may include an undoped semiconductor material, while the additional semiconductor material disposed thereover may include a doped semiconductor material having the same material as the undoped semiconductor material.

FIGS. 1N-1P are various views of a resultant structure of FIG. 1M, after subsequent fabrication processing including, for instance, gate replacement fabrication process and contact formation over the S/D region 118 and additional semiconductor material 120 (see FIG. 1M), in accordance with one or more aspects of the present invention. In the depicted embodiment, assuming that the gate structure is a sacrificial gate structure, the gate material of the gate structure may be subsequently replaced with a replacement gate material 112', as part of a gate-replacement fabrication process. Note that, as shown in FIG. 1N, the recessed isolation layer 104' may be etched, prior to forming the replacement gate material 112'.

FIG. 1O illustrates the formation of the contacts 122 over the S/D region 118 and additional semiconductor material 120, in accordance with one or more aspects of the present invention. Although not depicted in the figures, a silicide may optionally be formed using a metal such as, cobalt, nickel, titanium, tantalum, platinum, palladium, rhodium and combinations thereof, that has been chemically reacted with the semiconductor material (such as, for example, silicon) of S/D region 118 and additional semiconductor material 120. Further, the contact 122 (i.e. S/D contact) may be formed by, for instance, by providing a conductive material over the respective silicide (not shown). The conductive material may be formed by employing one or more conventional deposition processes such as, for example, sputtering, plating, evaporation, chemical vapor deposition (CVD), plasma enhanced chemical vapor deposition (PECVD), chemical solution deposition, atomic layer deposition (ALD) or the like. In one example, the conductive material may be or include a metal such as, for example, tantalum (Ta), tantalum nitride (TaN), titanium (Ti), titanium nitride (TiN), tungsten (W), tungsten nitride (WN) or combinations thereof.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form of contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the present invention for various embodiments with various modifications as are suited to the particular use contemplated.

What is claimed is:

1. A semiconductor device comprising:
a fin structure extended above a substrate structure, the fin structure including a channel region of a first height above the substrate structure, and a recessed fin portion having a top surface, a first horizontal width, and a second height above the substrate structure that is less than the first height;
an epitaxially-grown semiconductor material, having a bottom surface with a second horizontal width greater than the first horizontal width of the recessed fin structure, and extending laterally out from the recessed fin portion to form at least one of a source region and a drain region of the semiconductor device, wherein the bottom surface of the epitaxially-grown semiconductor material contacts and overlies the recessed fin portion; and an additional semiconductor material having a different material composition from the epitaxially-grown semiconductor material, and disposed over the epitaxially-grown semiconductor material and in physical contact with both the bottom surface of the epitaxially-grown semiconductor material and at least one sidewall of the recessed fin portion, wherein the additional semiconductor material encloses both the epitaxially-grown semiconductor material and the recessed fin portion, and wherein the additional semiconductor material that encloses the epitaxially-grown semiconductor material and the recessed fin portion has a single material composition.

2. The semiconductor device of claim 1, wherein the recessed fin portion induces a residual stress into the channel region of the fin structure, the residual stress being dependent on a height of the recessed fin portion.

3. The semiconductor device of claim 1, wherein the horizontally planar bottom surface of the at least one of the source region and the drain region extends symmetrically out from the recessed fin portion.

4. The semiconductor device of claim 1, wherein the epitaxially-grown semiconductor material comprises a stressor material, the epitaxially-grown semiconductor material over the recessed fin portion exerts an asymmetric stress across the channel region of the fin structure.

5. The semiconductor device of claim 1, wherein the additional semiconductor material increases a width of the at least one of the source region and the drain region and is shaped to asymmetrically stress the channel region of the fin structure.

6. The semiconductor device of claim 1, wherein the epitaxially-grown semiconductor material comprises a first silicon germanium material having a first germanium content, and the additional semiconductor material comprises a second silicon germanium material having a second germanium content, the first germanium content being different from the second germanium content.

7. The semiconductor device of claim 1, further comprising a gate structure extending at least partially over the fin structure, wherein the isolation layer is disposed below a lower surface of the gate structure.

8. The semiconductor device of claim 1, wherein the epitaxially-grown semiconductor material disposed over the recessed fin has an undercut region adjacent to the at least one side wall of the recessed fin portion, and wherein the additional semiconductor material fills the undercut region of the epitaxially-grown semiconductor material.

9. A semiconductor device comprising:
a fin structure extended above a substrate, the fin structure comprising a channel region of a first height above the substrate, and a recessed fin portion having a top surface, a first horizontal width, and a second height above the substrate that is less than the first height;
an epitaxially-grown semiconductor material, having a bottom surface with a second horizontal width greater than the first horizontal width of the recessed fin structure, and extending laterally out from the recessed fin portion to form at least one of a source region and a drain region of the semiconductor device, wherein the source or drain region has a horizontally planar bottom surface, wherein the epitaxially-grown semiconductor material includes a bottom surface vertically distal to a top surface of the substrate, and wherein the bottom surface of the epitaxially-grown semiconductor material contacts and overlies the recessed fin portion; and an additional semiconductor material having a different material composition from the epitaxially-grown semiconductor material, and disposed over the epitaxially-grown semiconductor material and in physical contact with both the bottom surface of the epitaxially-grown semiconductor material and at least one sidewall of the recessed fin portion, wherein the additional semiconductor material encloses both the epitaxially-grown semiconductor material and the recessed fin portion, and wherein the additional semiconductor material that encloses the epitaxially-grown semiconductor material and the recessed fin portion has a single material composition.

10. The semiconductor device of claim 9, wherein the recessed fin portion induces a residual stress into the channel region of the fin structure, the residual stress being dependent on the second height of the recessed fin portion.

11. The semiconductor device of claim 9, wherein the horizontally planar bottom surface of the at least one of the source region and the drain region extend symmetrically out from the recessed fin portion.

12. The semiconductor device of claim 9, wherein the epitaxially-grown semiconductor material includes a stressor material, the epitaxially-grown semiconductor material over the recessed fin portion exerts an asymmetric stress across the channel region of the fin structure.

13. The semiconductor device of claim 9, wherein a bottom surface of the additional semiconductor material is below the bottom surface of the epitaxially-grown semiconductor material.

14. The semiconductor device of claim 9, further comprising a gate structure extending at least partially over the fin structure, and an isolation layer disposed below a lower surface of the gate structure.

15. The semiconductor device of claim 9, wherein the epitaxially-grown semiconductor material disposed over the recessed fin has an undercut region adjacent to the at least one side wall of the recessed fin portion, and wherein the additional semiconductor material fills the undercut region of the epitaxially-grown semiconductor material.

16. A semiconductor device comprising:
a fin structure on a substrate, the fin structure including a channel region having a first height above the substrate, and a recessed fin portion having a top surface, a first horizontal width, and a second height above the substrate that is less than the first height;
an epitaxially-grown semiconductor material, having a bottom surface with a second horizontal width greater than the first horizontal width of the recessed fin structure, and extending laterally out from the recessed fin portion to form at least one of a source region and a drain region of the semiconductor device, wherein the source or drain region has a horizontally planar bottom surface, wherein a height of the epitaxially-grown semiconductor material above the recessed fin portion is greater than the second height of the recessed fin portion above the substrate, and wherein the bottom surface of the epitaxially-grown semiconductor material contacts and overlies the recessed fin portion; and
an additional semiconductor material having a different material composition from the epitaxially-grown semiconductor material, and disposed over the epitaxially-grown semiconductor material and in physical contact with both the bottom surface of the epitaxially-grown semiconductor material and the at least one sidewall of the recessed fin portion, and the top surface of the substrate structure, wherein the additional semiconductor material encloses both the epitaxially-grown semiconductor material and the recessed fin portion, and wherein the additional semiconductor material that encloses the epitaxially-grown semiconductor material and the recessed fin portion has a single material composition.

17. The semiconductor device of claim 16, wherein the horizontally planar bottom surface of the at least one of the source region and the drain region extend symmetrically out from the recessed fin portion.

18. The semiconductor device of claim 16, wherein the different material composition of the additional semiconductor material includes silicon germanium (SiGe).

19. The semiconductor device of claim 16, wherein a bottom surface of the additional semiconductor material is below the bottom surface of the epitaxially-grown semiconductor material.

20. The semiconductor device of claim 16, further comprising a gate structure extending at least partially over the fin structure, and an isolation layer disposed below a lower surface of the gate structure.

* * * * *